(12) United States Patent
Jeng

(10) Patent No.: US 7,915,173 B2
(45) Date of Patent: Mar. 29, 2011

(54) SHALLOW TRENCH ISOLATION STRUCTURE HAVING REDUCED DISLOCATION DENSITY

(75) Inventor: Pei-Ren Jeng, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 1394 days.

(21) Appl. No.: 11/122,774

(22) Filed: May 5, 2005

(65) Prior Publication Data
US 2006/0252228 A1    Nov. 9, 2006

(51) Int. Cl.
*H01L 21/311* (2006.01)
(52) U.S. Cl. .................... 438/700; 438/701; 257/626
(58) Field of Classification Search .................. 438/700, 438/701, 702, 696; 257/622, 623, 626
See application file for complete search history.

(56) References Cited

U.S. PATENT DOCUMENTS

| | | | |
|---|---|---|---|
| 5,087,586 A | 2/1992 | Chan et al. | |
| 5,447,884 A | 9/1995 | Fahey et al. | |
| 5,492,858 A | 2/1996 | Bose et al. | |
| 5,702,976 A | 12/1997 | Schuegraf et al. | |
| 5,719,085 A * | 2/1998 | Moon et al. | 438/424 |
| 5,994,756 A | 11/1999 | Umezawa et al. | |
| 6,027,982 A | 2/2000 | Peidous et al. | |
| 6,037,238 A | 3/2000 | Chang et al. | |
| 6,297,128 B1 | 10/2001 | Kim et al. | |
| 6,368,941 B1 * | 4/2002 | Chen et al. | 438/424 |
| 6,455,912 B1 | 9/2002 | Kim et al. | |
| 6,503,815 B1 | 1/2003 | Hsu | |
| 6,518,148 B1 | 2/2003 | Cheng et al. | |
| 6,657,276 B1 | 12/2003 | Karlsson et al. | |
| 2003/0216006 A1 * | 11/2003 | Li et al. | 438/424 |
| 2005/0142775 A1 * | 6/2005 | Koh | 438/296 |

* cited by examiner

*Primary Examiner* — S. V Clark
(74) *Attorney, Agent, or Firm* — Knobbe, Martens, Olson & Bear LLP

(57) ABSTRACT

A method for manufacturing a shallow trench isolation structure comprises etching a plurality of trenches into a silicon substrate. The trenches have an upright wall portion, a bottom floor portion, and a corner portion connecting the upright wall portion and the bottom floor portion. The method further comprises conformally depositing a dielectric layer into the trenches. The dielectric layer covers at least part of the upright wall portion, at least part of the bottom floor portion, and at least part of the corner portion. The method further comprises oxidizing the dielectric layer. A portion of the dielectric layer deposited over the corner portion is oxidized at a first oxidization rate, and a portion of the dielectric layer deposited over the upright wall portion is oxidized at a second oxidization rate. The first oxidization rate is less than the second oxidization rate. The method further comprises depositing an electrically insulating material into the trenches over the dielectric layer.

29 Claims, 5 Drawing Sheets

SHALLOW TRENCH ISOLATION STRUCTURE HAVING REDUCED DISLOCATION DENSITY

FIELD OF THE INVENTION

The present invention relates generally to integrated circuit fabrication techniques, and more specifically to formation of improved shallow trench isolation structures for use in integrated circuit devices.

BACKGROUND OF THE INVENTION

In the field of integrated circuit fabrication, the drive to reduce circuit size has led to smaller electronic devices being packed with greater density on a common substrate. Examples of typical electronic devices used in integrated circuit applications include active devices, such as transistors, and passive devices, such as resistors and capacitors. Generally, the reliability of densely-packed electronic devices depends in part on providing sufficient electrical isolation between adjacent devices in the integrated circuit.

One common way to electrically isolate adjacent devices from each other is through the formation of local oxidization of silicon ("LOCOS") structures. LOCOS structures are typically formed by depositing a non-oxidizable mask, such as silicon nitride ($Si_3N_4$), over a blank silicon wafer. The mask is patterned using photolithography, and then a film of silicon oxide ($SiO_2$) is formed on the portions of the silicon surface exposed by the photolithographic process. The oxide film layer functions to electrically isolate devices formed over the portions of the substrate where the non-oxidizable mask remains.

Another common way to electrically isolate adjacent devices from each other is to form shallow trench isolation ("STI") structures between the devices in the substrate. STI structures are typically formed by etching shallow trenches in the substrate between areas where electronic devices are to be formed, and then filling the trenches with an electrically insulating material, such as silicon oxide or another dielectric material. After the trenches are filled, the wafer surface is planarized by a chemical mechanical polish ("CMP") process so that the insulating material remains in the trench, with its top surface level with that of the exposed silicon substrate. The "buried" insulating material provides electrical isolation between adjacent devices formed on or within the exposed substrate surface. A typical insulating material used to fill STI trenches is oxide, thin films of which are deposited using a high density plasma chemical vapor deposition ("HDP-CVD") process.

SUMMARY OF THE INVENTION

While LOCOS structures provide effective electrical isolation in certain applications, there are significant limitations to LOCOS technology. For example, LOCOS structures consume substantial amounts of silicon active area on the substrate surface, thereby reducing the area available to be used in the formation of electronic devices. Additionally, LOCOS structures have a non-planar surface topology that adversely affects process yield and complexity of subsequent substrate processing steps. Furthermore, lateral oxidization of the silicon underneath the silicon nitride mask tends to occur in conventional LOCOS methodology, thereby forming a "bird's beak" structure at the edges of the patterned oxide.

Likewise, conventional STI technology also suffers from certain disadvantages. For example, as the width of an STI trench decreases, so does the width of the insulating material filing the trench. If the defect density in the insulating material filling the trench is too high, the insulating material will have a reduced capacity to provide effective electrical isolation. In particular, STI trenches that are formed using many conventional techniques and that have a width less than about 180 Å have a significantly reduced capacity to provide electrical isolation between adjacent electronic devices. Defects in the insulating material often result from mechanical and thermal stresses placed on the substrate and/or the insulating material during formation of the STI trench structures.

In accordance with the foregoing, Applicant has developed an improved approach for electrically isolating densely-packed devices provided on a common semiconductor substrate. In certain embodiments, a STI structure is provided with an improved, rounded profile that reduces the density of stress-induced dislocations in the insulating material at the corners of the trench. The reduced dislocation density in the insulating material provides the STI structure with improved electrical insulation characteristics.

According to one embodiment of the present invention, a method for manufacturing a shallow trench isolation structure comprises etching a plurality of trenches into a silicon substrate. The trenches have an upright wall portion, a bottom floor portion, and a corner portion connecting the upright wall portion and the bottom floor portion. The method further comprises conformally depositing a dielectric layer into the trenches. The dielectric layer covers at least part of the upright wall portion, at least part of the bottom floor portion, and at least part of the corner portion. The method further comprises oxidizing the dielectric layer. A portion of the dielectric layer deposited over the corner portion is oxidized at a first oxidization rate, and a portion of the dielectric layer deposited over the upright wall portion is oxidized at a second oxidization rate. The first oxidization rate is less than the second oxidization rate. The method further comprises depositing an electrically insulating material into the trenches over the dielectric layer.

According to another embodiment of the present invention, a method comprises etching a trench into a substrate. The method further comprises forming a dielectric layer in the trench. The dielectric layer includes a trench wall portion, a trench floor portion and a trench corner portion connecting the wall portion with the floor portion at an angled joint. The method further comprises oxidizing the dielectric layer. The trench wall portion is oxidized more rapidly than the trench corner portion, thereby modifying the trench corner portion from the angled joint to a rounded joint.

According to another embodiment of the present invention, an semiconductor structure comprises a silicon substrate having a trench etched therein. The trench has an upper wall portion, a bottom floor portion and a corner portion connecting the upper wall portion and the bottom floor portion. The semiconductor structure further comprises an oxide layer formed on the upper wall, the bottom floor and the corner portions of the trench. The oxide layer has a first thickness adjacent to the upper wall portion of the trench, and a second thickness over the corner portion of the trench. The second thickness is less than the first thickness. The semiconductor structure further comprises an electrically insulating material positioned within the trench and over the oxide layer. The oxide layer is positioned between the electrically insulating material and the silicon substrate.

BRIEF DESCRIPTION OF THE DRAWINGS

Exemplary embodiments of the improved STI techniques and structures are illustrated in the accompanying drawings, which are for illustrative purposes only. The drawings comprise the following figures, in which like numerals indicate like parts.

DETAILED DESCRIPTION OF PREFERRED EMBODIMENTS

Figure 1:
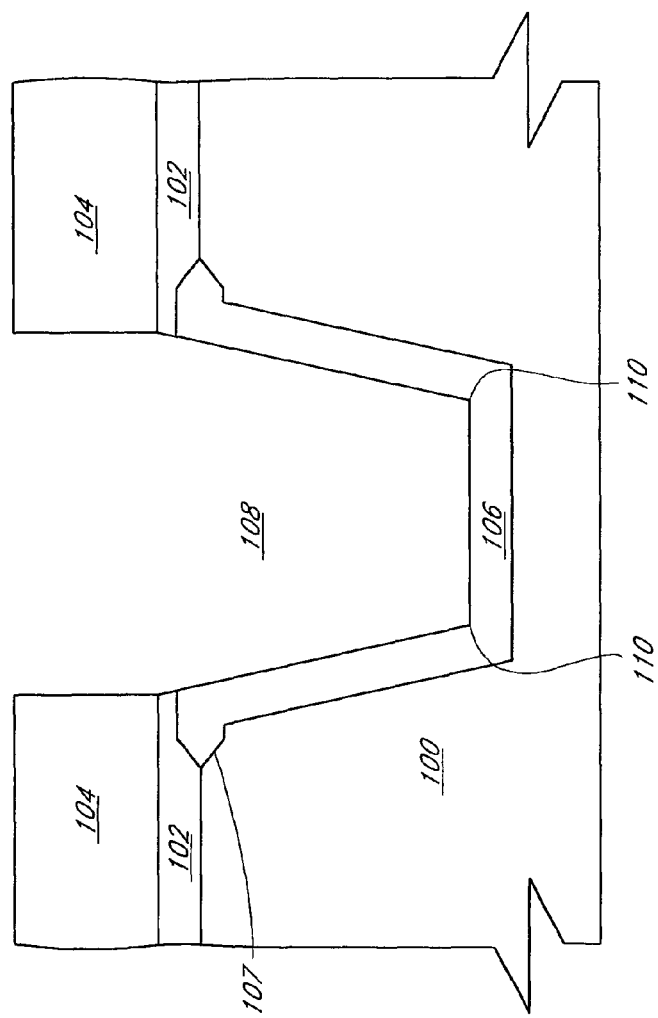
FIG. 1 is a cross-sectional view of a conventional STI structure.

As described herein, the ability of an STI trench to provide adequate electrical isolation is compromised by the presence of a high defect density in the insulating material filling the trench. Defects in the insulating material often result from mechanical and thermal stresses that result from the shape of the STI trench structure. This effect is illustrated in FIG. 1, which is a cross-sectional view of a conventional STI structure. This structure includes a silicon substrate 100 having a silicon oxide layer 102 and a silicon nitride layer 104 formed thereover. A trench 108 is etched through the oxide and nitride layers into the substrate 100. Using a conventional oxidization process, such as dry or wet thermal oxidization, a sidewall oxide layer 106 is formed over the surface of the trench 108. When the trench 108 is subsequently filled with an insulating material, for example using a HDP-CVD technique, the sidewall oxide layer 106 helps to reduce stress in the insulating layer.

The example conventional STI trench structure illustrated in FIG. 1 suffers from several disadvantages. For example, an oxide encroachment 107, also commonly referred to as a "bird's beak", is formed when $H_2O$ and $O_2$ diffuse into the interface between the silicon substrate 100 and the silicon oxide layer 102. The encroachment 107 acts as a source for the generation of defects in the insulating material filled into the trench 108. Additionally, the sharp corners 110 at the bottom of the STI trench also cause a high level of embedded stress in the insulating material filling the trench 108, thereby providing yet another source for the generation of defects. In some applications, the corners 110 of the trench are etched slightly deeper than the center of the trench, thereby making the corners 110 even sharper, particularly after application of the sidewall oxide layer 106. This further increases the level of embedded stress, and therefore the defect density, in the insulating material filling the trench 108. As described herein, defects in the insulating material filling the trench 108 result in leakage current through the trench 108, thereby degrading the reliability of neighboring active devices separated by the trench 108.

One approach to reduce defect density in the insulating material filling STI trenches is to sequentially deposit alternating layers of insulating materials having tensile stress and compressive stress. Theoretically, these alternating layers of insulating material will function to compensate for the overall structural stress in the bulk insulator. However, from a practical production standpoint, it is difficult or impossible to reduce the structural stress to a level that provides adequate reduction of structural defects in the bulk insulator material using this technique. Additionally, as a result of the deposition of multiple layers of insulator material, it is difficult to accurately control the subsequent CMP process that is used to provide the integrated circuit with a planar surface.

Another approach to reduce defect density in the insulator material used to fill STI trenches is to perform a high-temperature anneal after filling the trench. The anneal is intended to reduce the mechanical stress and therefore the dislocation density in the insulating material deposited in the trench. However, in embodiments wherein a sidewall oxide layer 106 is provided on the surface of the isolation trench, the anneal step disadvantageously causes thermal stress to be induced in this layer, and this thermal stress acts as yet another source for dislocations in the insulating material.

Figure 2:
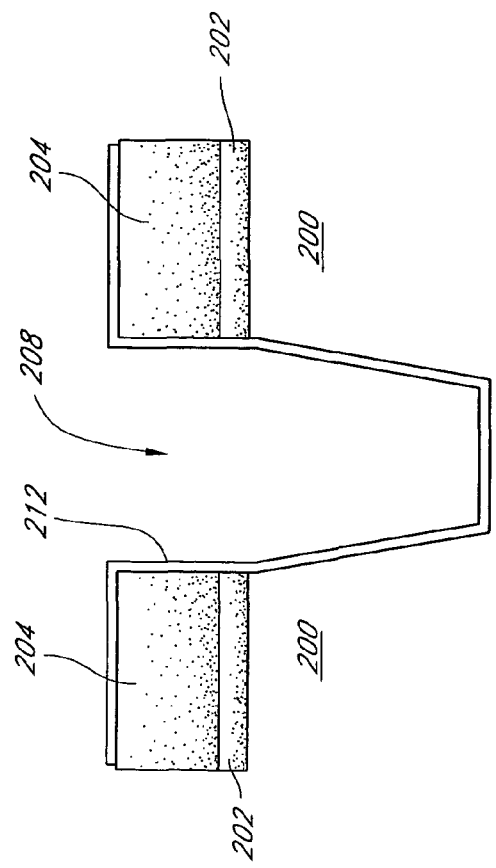
FIG. 2 is a cross-sectional view of an STI trench having a silicon nitride layer conformally deposited thereover.

In accordance with the foregoing, Applicant has developed an improved approach for reducing defect density in the insulating material deposited in an STI trench structure. As shown in the exemplary embodiment illustrated FIG. 2, an STI trench 208 is etched through a silicon nitride layer 204, an oxide layer 202, and into a substrate 200. In an exemplary embodiment, the substrate 200 is a silicon substrate with a <100> crystallographic orientation. However, in other embodiments, the substrate comprises other semiconductor substrates, such as a silicon-on-insulator ("SOI") substrate. In an exemplary embodiment, the oxide layer 202 comprises a silicon dioxide layer formed by a thermal growth process and having a thickness between about 20 Å and about 300 Å. In an exemplary embodiment, the silicon nitride layer 204 has a thickness between about 100 Å and about 2000 Å. In a modified embodiment, the silicon nitride layer is substituted by an appropriate alternate material other than silicon nitride.

The depth of the STI trench 208 depends, at least in part, on the type of device to be isolated by the trench. For example, in flash memory applications, the trench is usually between about 2500 Å and about 4500 Å. To separate logic devices, such as metal oxide semiconductor ("MOS") transistors, the trench is usually between about 2000 Å and about 4000 Å. In an exemplary embodiment, the trench is formed by anisotropic etching, such as reactive ion etching, although other etching techniques are used in other embodiments.

A thin, conformal silicon nitride layer 212 is then conformally deposited over the etched trench 208. In one embodiment the conformal silicon nitride layer 212 has a thickness between about 25 Å and about 300 Å, in another embodiment the conformal silicon nitride layer 212 has a thickness between about 30 Å and about 200 Å, in another embodiment the conformal silicon nitride layer 212 has a thickness between about 50 Å and about 150 Å, and in another embodiment the conformal silicon nitride layer 212 has a thickness between about 75 Å and about 125 Å.

Figure 3:
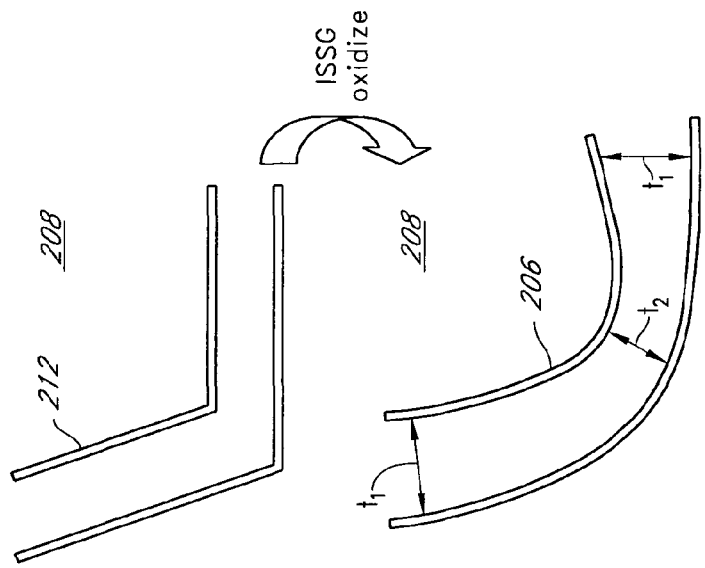
FIG. 3 is an enlarged view of a lower corner the STI trench of FIG. 2 after performing an in situ steam generated oxide process.

In such embodiments, the silicon nitride layer 212 is then selectively oxidized by an in situ steam generated ("ISSG") oxidization process. An example of a processing tool that is capable of performing an ISSG oxidization process is a Centura® 5000 system marketed by Applied Materials Corporation (Santa Clara, Calif.). During the ISSG process, the silicon nitride on the bottom corners of the trench 208 has a relatively low oxidization rate as compared to the silicon nitride on the other (upright and horizontal) portions of the trench 208. Consequently, in the time used to oxidize the silicon nitride at the bottom corners of the trench 208, not only will the silicon nitride on the other portions of the trench 208 also be oxidized, but a portion of the underlying silicon substrate 200 will be oxidized as well. Because the ISSG oxidization process oxidizes different surfaces of the trench 208 at different rates, this results in a modified sidewall oxide layer in the trench 208 having a variable thickness, as illustrated in FIG. 3. Specifically, FIG. 3 illustrates that the ISSG oxidization process causes the conformal silicon nitride layer 212 to have a relatively larger thickness $t_1$ in the upright and horizontal portions of the trench 208, and a relatively smaller thickness $t_2$ in the corner portion of the trench 208.

The relative rates of silicon nitride deposition and oxidization (by ISSG) are provided in Table A for various portions of the STI trench.

TABLE A

| Local Topology of STI Trench | SiN Deposition Rate (flat = 1.00) | ISSG Oxidization Rate (flat = 1.00) |
|---|---|---|
| flat (trench sides and floor) | 1.00 | 1.00 |
| out-swinger (trench top corners) | 1.00 | 0.98 |
| in-swinger (trench bottom corners) | 1.00 | 0.25 |

As illustrated in Table A, while the conformal silicon nitride layer 212 is deposited across the substrate at a uniform rate, the ISSG oxidization technique allows that layer to be oxidized non-uniformly based on the local topology. In particular, in the one exemplary embodiment for which data are provided in Table A, the silicon nitride located in the bottom corners of the STI trench is oxidized approximately four times slower than silicon nitride location on other portions of the STI trench structure. The data provided in Table A were obtained using transmission electron microscopy.

In one embodiment, the ISSG oxidization process uses a hydrogen gas percentage (% $H_2$) of between approximately 1% and approximately 50%, in another embodiment the ISSG oxidization process uses a % $H_2$ of between approximately 5% and approximately 33%, an in another embodiment the ISSG oxidization process uses a % $H_2$ of between approximately 10% and approximately 25%. The hydrogen gas percentage % $H_2$ is defined by the following expression:

% $H_2 = (H_2 \text{ flow rate}) \times (H_2 \text{ flow rate} + O_2 \text{ flow rate})^{-1}$ By forming a variable-thickness silicon nitride layer in the STI trench, a modified sidewall oxide layer 206 is provided in the STI trench. As illustrated in FIG. 3, the modified sidewall oxide layer 206 has a rounded corner, as compared to the sharp corner 110 of the conventional STI trench illustrated in FIG. 1. When an insulating material is deposited into the STI trench having the modified sidewall oxide layer 206, the result is reduced mechanical stress in the insulating material by virtue of the rounded corner. This results in a lower dislocation density in the insulating material.

Figure 4:
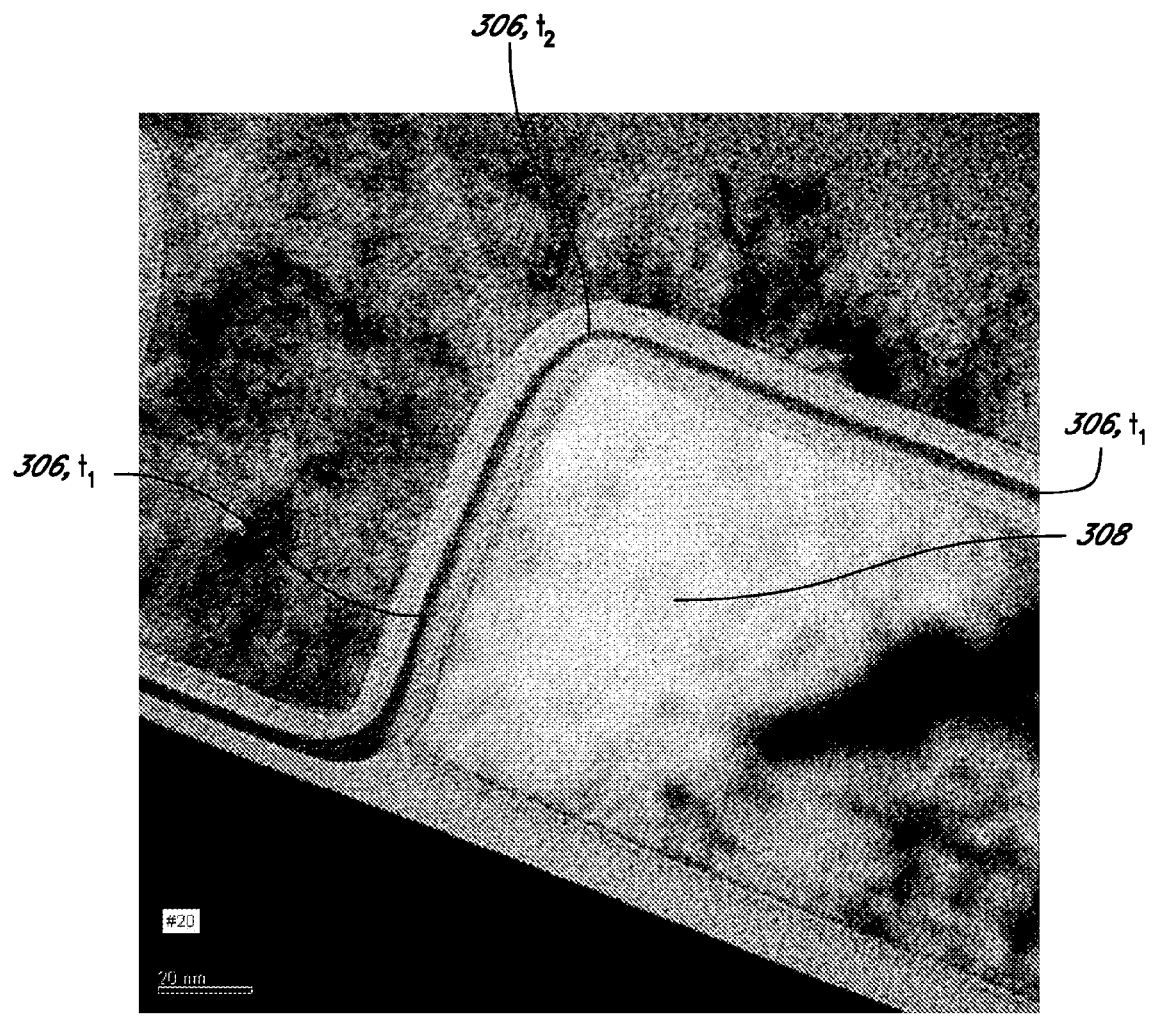
FIG. 4 is a cross-sectional photograph of a portion of an STI structure formed using an exemplary embodiment.
Figure 5:
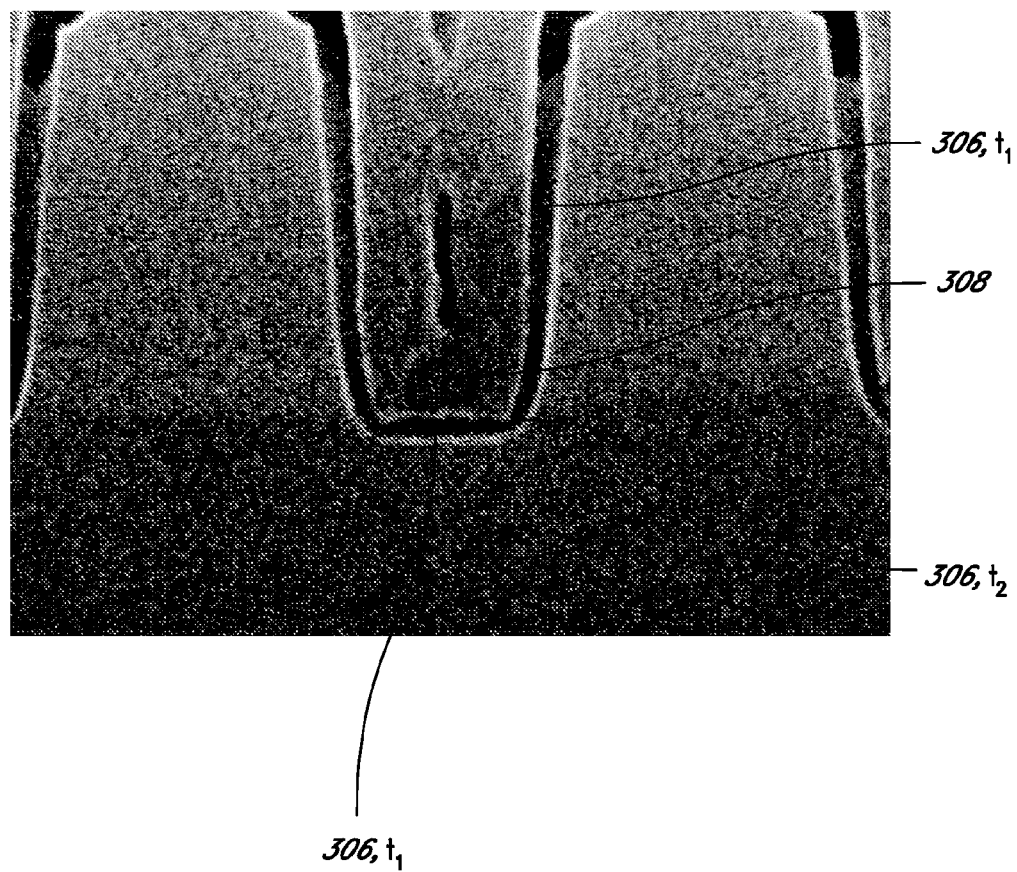
FIG. 5 is a cross-sectional photograph of an STI trench formed using an exemplary embodiment.

FIG. 4 is a photograph of a portion of an STI trench 308 formed using certain of the exemplary embodiments disclosed herein. The photograph illustrates a modified sidewall oxide layer 306 having a first thickness $t_1$ in flat portions of the trench wall, and a second thickness $t_2$ in the corners of the trench, wherein $t_1 > t_2$. A similar structure is illustrated in FIG. 5. The photographs of FIGS. 4 and 5 were obtained using a transmission electron microscope and a scanning electron microscope, respectively.

Figure 6:
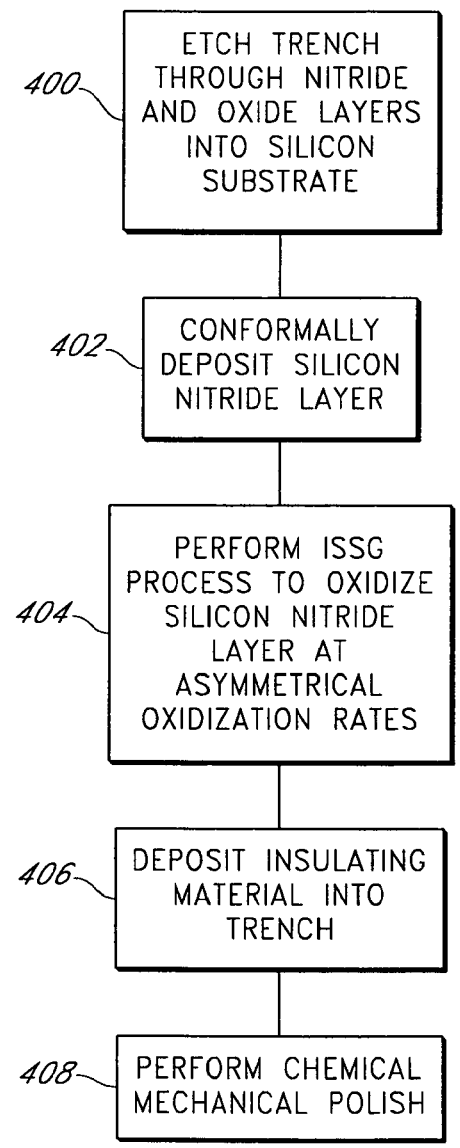
FIG. 6 is a flow chart illustrating an exemplary method for forming an STI trench having an insulating material reduced dislocation density deposited therein.

An exemplary embodiment of the technique disclosed herein is schematically illustrated in the flowchart of FIG. 6. In such embodiments, a trench is etched through nitride and oxide layers and into an underling silicon substrate in an operational block 400. A silicon nitride layer is then conformally deposited over the trench in an operational block 402. An ISSG process is then performed to oxidize the conformally-deposited silicon nitride layer in an operational block 404. In an exemplary embodiment, the ISSG process is tuned to oxidize the silicon nitride at an asymmetrical oxidization rate depending on the local topology, such that silicon nitride located at the bottom corners of the STI trench is oxidized slower than other portions of the silicon nitride. This results in thinner oxidation around the corners of the STI trench. In such embodiments, this asymmetrical oxidization causes a modified sidewall oxidization layer to be formed in the STI trench with rounded bottom corners. An insulating material is then deposited into the trench in an operational block 406, and this is optionally followed by a CMP process in operational block 408 to provide an overlying planar surface.

Certain of the exemplary embodiments disclosed herein provide advantages over many conventional techniques for forming STI trenches, and allow even narrower trenches to be formed without sacrificing the ability to provide effective electrical isolation. In particular, certain of the exemplary embodiments disclosed herein allow a STI structure to be formed that has reduced defect density. Such embodiments include a rounded sidewall oxide layer that provides reduced structural stress in the insulation material filing the trench.

SCOPE OF THE INVENTION

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than shallow trench isolation structures.

I claim:

1. A method for manufacturing a shallow trench isolation structure, the method comprising:
   etching a plurality of trenches into a silicon substrate, the trenches having an upright wall portion, a bottom floor portion, and a corner portion connecting the upright wall portion and the bottom floor portion;
   conformally depositing a dielectric layer into the trenches, the dielectric layer covering at least part of the upright wall portion, at least part of the bottom floor portion, and at least part of the corner portion;
   oxidizing the dielectric layer, wherein a portion of the dielectric layer deposited over the corner portion is oxidized at a first oxidization rate, and a portion of the dielectric layer deposited over the upright wall portion is oxidized at a second oxidization rate, wherein the first oxidization rate is less than the second oxidization rate; and
   depositing an electrically insulating material into the trenches over the dielectric layer.

2. The method of claim 1, wherein oxidizing the dielectric layer comprises performing an in situ steam generated oxidization process using a hydrogen gas percentage (% $H_2$) between approximately 1% and approximately 50%.

3. The method of claim 1, wherein oxidizing the dielectric layer comprises performing an in situ steam generated oxidization process.

4. The method of claim 1, wherein the first oxidation rate is between approximately 20% and approximately 30% of the second oxidation rate.

5. The method of claim 1, further comprising oxidizing a portion of the silicon substrate adjacent to the upright wall portion of the trench.

6. The method of claim 1, wherein the electrically insulating material is silicon dioxide.

7. The method of claim 1, wherein the electrically insulating material is deposited using a high density plasma chemical vapor deposition process.

8. The method of claim 1, further comprising performing a chemical mechanical polish process after depositing the electrically insulating material into the trenches.

9. The method of claim 1, wherein the silicon substrate has a <100> crystallographic orientation.

10. The method of claim 1, wherein etching the plurality of trenches further comprises etching through a dielectric layer formed over the silicon substrate.

11. The method of claim 1, wherein the trench has a depth of between about 2000 angstroms and about 4500 angstroms.

12. The method of claim 1, wherein the dielectric layer is silicon nitride.

13. The method of claim 1, wherein the dielectric layer has a thickness between approximately 25 angstroms and approximately 300 angstroms.

14. The method of claim 1, wherein the dielectric layer has a thickness between approximately 30 angstroms and approximately 200 angstroms.

15. A method comprising:
   etching a trench into a substrate;
   forming a dielectric layer in the trench, the dielectric layer including a trench wall portion, a trench floor portion and a trench corner portion connecting the wall portion with the floor portion at an angled corner; and
   oxidizing the dielectric layer, wherein the trench wall portion is oxidized more rapidly than the trench corner portion, thereby modifying the trench corner portion from the angled corner to a rounded corner.

16. The method of claim 15, wherein etching the trench further comprises etching through a dielectric layer formed over the substrate.

17. The method of claim 15, wherein the dielectric layer is a silicon nitride layer.

18. The method of claim 15, wherein the dielectric layer has a thickness between approximately 50 angstroms and approximately 150 angstroms.

19. The method of claim 15, wherein the dielectric layer has a thickness between approximately 75 angstroms and approximately 125 angstroms.

20. The method of claim 15, wherein the trench corner portion is oxidized at an oxidization rate that is between approximately 20% and approximately 30% of the trench wall portion.

21. The method of claim 15, wherein oxidizing the dielectric layer comprises performing an in situ steam generated oxidization process using a hydrogen gas percentage (% $H_2$) between approximately 5% and approximately 33%.

22. The method of claim 15, further comprising depositing an electrically insulating material into the trench and over the oxidized dielectric layer.

23. The method of claim 15, further comprising: depositing an electrically insulating material into the trench and over the oxidized dielectric layer; and performing a chemical mechanical polish process.

24. An semiconductor structure comprising:
   a silicon substrate having a trench etched therein, the trench having an upper wall portion, a bottom floor portion and a corner portion connecting the upper wall portion and the bottom floor portion;
   an oxide layer formed on the upper wall, the bottom floor and the corner portions of the trench, the oxide layer having a first thickness adjacent to the upper wall portion and the bottom floor of the trench, and a second thickness over the corner portion of the trench, wherein the second thickness is less than the first thickness, and the oxide layer is formed in the trench with rounded bottom corners; and
   an electrically insulating material positioned within the trench and over the oxide layer, such that the oxide layer is positioned between the electrically insulating material and the silicon substrate.

25. The semiconductor structure of claim 24, further comprising a dielectric layer formed over the silicon substrate such that the trench is also etched through the dielectric layer.

26. The semiconductor structure of claim 24, further comprising a dielectric layer formed over the silicon substrate such that the trench is also etched through the dielectric layer, wherein the dielectric layer comprises silicon nitride.

27. The semiconductor structure of claim 24, wherein the trench has a depth between approximately 2000 angstroms and approximately 4500 angstroms.

28. The semiconductor structure of claim 24, wherein the oxide layer has a thickness between approximately 150 angstroms and approximately 50 angstroms.

29. The semiconductor structure of claim 24, wherein the electrically insulating material is silicon dioxide.

* * * * *